(12) United States Patent  
Sato

(10) Patent No.: US 6,377,497 B2
(45) Date of Patent: Apr. 23, 2002

(54) MULTILEVEL STORAGE SEMICONDUCTOR MEMORY READ CIRCUIT

(75) Inventor: Akira Sato, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/748,035

(22) Filed: Dec. 22, 2000

(30) Foreign Application Priority Data

Dec. 28, 1999 (JP) .......................................... 11-372431

(51) Int. Cl.[7] ................................................ G11C 7/00
(52) U.S. Cl. .............. 365/196; 365/189.05; 365/185.03
(58) Field of Search ............................ 365/189.05, 205, 365/207, 208, 185.03, 196

(56) References Cited

U.S. PATENT DOCUMENTS 5,594,691 A * 1/1997 Bashir .................. 365/189.09
5,930,172 A * 7/1999 Kucera .................. 365/185.21

FOREIGN PATENT DOCUMENTS

| JP | 1-196791 | 8/1989 | .......... G11C/11/34 |
| JP | 07-037393 | 2/1995 | .......... G11C/11/56 |
| JP | 10-011982 | 1/1998 | .......... G11C/16/04 |
| JP | 11-110974 | 4/1999 | .......... G11C/11/56 |

* cited by examiner

Primary Examiner—Vu A. Le
(74) Attorney, Agent, or Firm—Hayes Soloway P.C.

(57) ABSTRACT

In a read circuit, a sense amplifier amplifies a current flowing in a cell and determining whether the cell is an ON cell or an OFF cell. A latch circuit group consists of latch circuits latching output data from the sense amplifier. An encoder circuit converts the latched data into binary data. An output circuit outputs the encoded data. A stop and correction circuit stops an operation of a first-stage or third-stage sense amplifier circuit based on an output result of a second-stage latch circuit and applies a signal expected to be outputted from the sense amplifier which is being stopped, as a latch input signal L0.

6 Claims, 10 Drawing Sheets

FIG. 2
(PRIOR ART)

| | SUB-ORDINATE DATA B0 | SUPER-ORDINATE DATA B1 | WORD LEVEL | | |
|---|---|---|---|---|---|
| | | | FIRST STAGE | SECOND STAGE | THIRD STAGE |
| VT0 | 0 | 0 | ON | ON | ON |
| VT1 | 0 | 1 | OFF | ON | ON |
| VT2 | 1 | 1 | OFF | OFF | ON |
| VT3 | 1 | 0 | OFF | OFF | OFF |

FIG. 7

|  | SUB-ORDINATE DATA B0 | SUPER-ORDINATE DATA B1 | WORD LEVEL | | |
|---|---|---|---|---|---|
|  |  |  | FIRST STAGE | SECOND STAGE | THIRD STAGE |
| VT0 | 0 | 0 | ON | ON | ON |
| VT1 | 0 | 1 | OFF | ON | ON |
| VT2 | 1 | 1 | OFF | OFF | ON |
| VT3 | 1 | 0 | OFF | OFF | OFF |

ALWAYS ON WHEN SECOND STAGE IS ON

ALWAYS OFF WHEN SECOND STAGE IS OFF

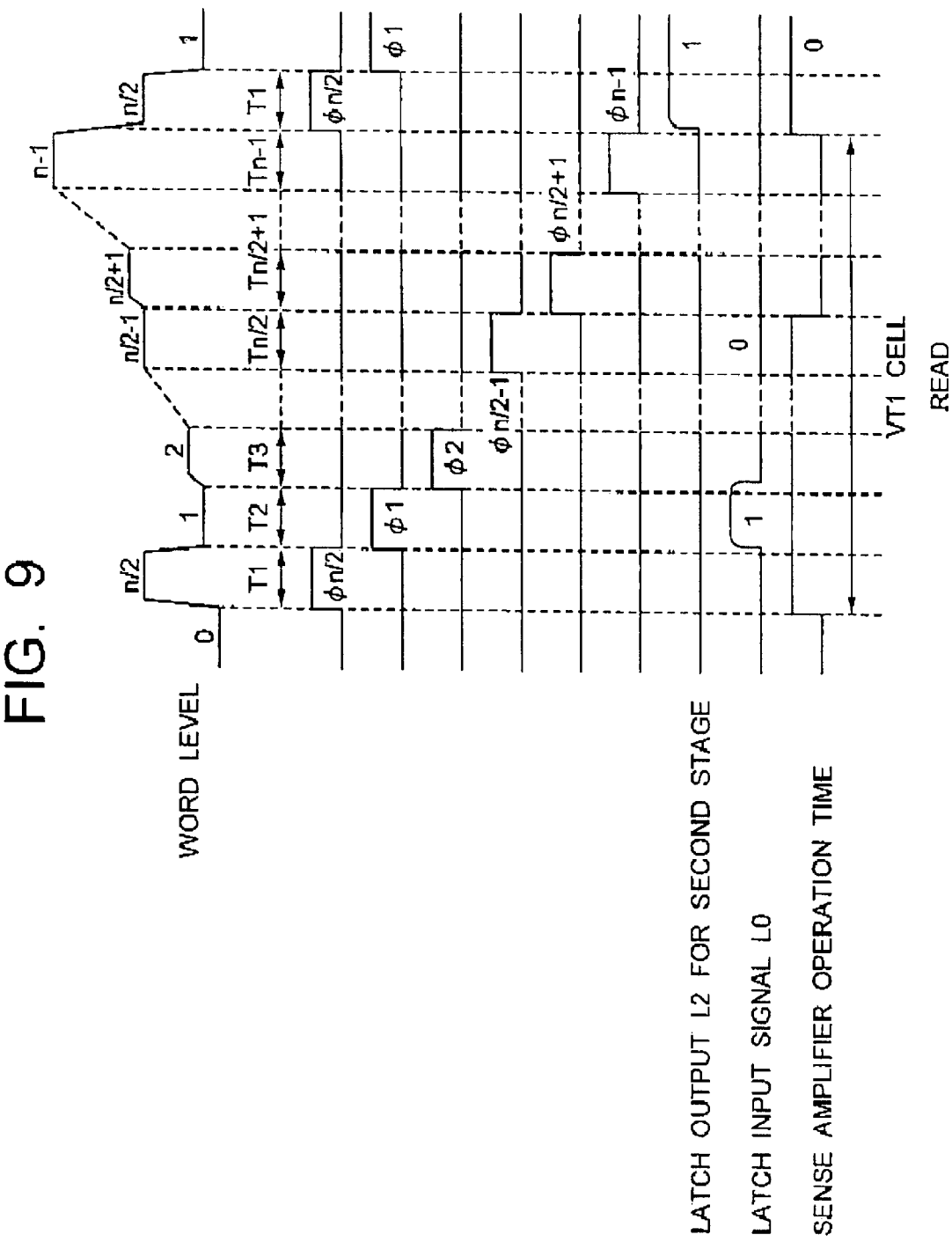

FIG. 10

| | SUB-ORDINATE DATA | MIDDLE-LEVEL DATA | SUPER-ORDINATE DATA | WORD LEVEL | | | | | | |
|---|---|---|---|---|---|---|---|---|---|---|
| | | | | FIRST STAGE | SECOND STAGE | THIRD STAGE | FOURTH STAGE | FIFTH STAGE | SIXTH STAGE | SEVENTH STAGE |
| VT0 | 0 | 0 | 0 | ON | ON | ON | ON | ON | ON | ON |
| VT1 | 0 | 0 | 1 | OFF | ON | ON | ON | ON | ON | ON |
| VT2 | 0 | 1 | 1 | OFF | OFF | ON | ON | ON | ON | ON |
| VT3 | 0 | 1 | 0 | OFF | OFF | OFF | ON | ON | ON | ON |
| VT4 | 1 | 1 | 0 | OFF | OFF | OFF | OFF | ON | ON | ON |
| VT5 | 1 | 1 | 1 | OFF | OFF | OFF | OFF | OFF | ON | ON |
| VT6 | 1 | 0 | 1 | OFF | OFF | OFF | OFF | OFF | OFF | ON |
| VT7 | 1 | 0 | 1 | OFF | OFF | OFF | OFF | OFF | OFF | OFF |

α ALWAYS ON WHEN FORTH STAGE IS ON

β ALWAYS OFF WHEN FORTH STAGE IS OFF

US 6,377,497 B2

1

MULTILEVEL STORAGE SEMICONDUCTOR MEMORY READ CIRCUIT

BACKGROUND OF THE INVENTION

1. Field of the Invention

The present invention relates to a semiconductor memory read circuit for changing the word voltage of a multilevel storage semiconductor memory by stages such as from second stage→first stage→third stage or from fourth stage→second stage→sixth stage→first stage→third stage→fifth stage→seventh stage. Particularly, the present invention relates to a multilevel storage semiconductor memory read circuit capable of reducing power consumption by shortening sense amplifier operation time.

2. Description of the Related Art

A conventional read method in a multilevel memory is to actuate a sense amplifier for each of the word voltages at respective stages and to obtain ON/OFF outputs according to the threshold voltage VT of a multilevel cell. Then, the output results of the word voltages at the respective stages are latched by latch circuits, the respective latched outputs are logically operated by an encoder and data is transmitted to an output circuit FIG. 1 is a circuit diagram showing one example of the conventional read circuit. FIG. 2 is a truth table of the circuit diagram. FIG. 3 is a timing chart showing circuit operation. The output of a cell 712 of a read circuit 740 is inputted into a sense amplifier 713 and inputted from the sense amplifier 713 into a latch circuit group 711. The latch circuit group 711 has latch circuits 742, 741 and 743 for first to third stages, respectively. The outputs L1 and L3 of the first-stage latch circuit 742 and the third-stage latch circuit 743, respectively, are inputted into an EOR logic gate 715 of an encoder circuit 717. The output of the EOR logic gate 715 and the output L2 of the second-stage latch circuit 741 are inputted, as superordinate data B1 and subordinate data B0, into an output circuit 718, respectively.

Next, the operation of the conventional read circuit will be described. First, at an interval T1, the level of a signal ø2 for setting a word voltage at the second stage is "H" and the sense amplifier 713, therefore, reads a cell when the word level is at the second stage. As shown in the truth table of FIG. 2, since a VT1 cell is turned on at the second-stage word level, a "L" data indicating that the read cell is turned "ON" is outputted from the sense amplifier.

Next, when the interval moves from T1 to T2, the level of the signal ø2 inputted into the latch circuit 741 changes from "H" to "L". Due to this, the output data of the sense amplifier 713 is latched by the second-stage latch circuit 741 and transmitted, through the encoder circuit 717, to the output circuit 718 as the subordinate data B0. Namely, at this point, the subordinate data B0 on the truth table shown in FIG. 2 is determined. Also, since the level of the latch signal ø2 is "L" during the intervals T2 and T3, the level of the latch data L2 remains "L" until an interval T4.

Further, at the interval T2, the level of a signal ø1 for setting a word voltage at the first-stage voltage is "H" and the sense amplifier 713, therefore, outputs data when the word level is at the first stage.

Next, when the interval moves from T2 to T3, the level of the signal ø1 inputted into the latch circuit 742 changes from "H" to "L" and the output data of the sense amplifier 713 is, therefore, latched by the first-stage latch circuit 742, As in the case of the above, since the level of the latch signal ø1 is "L" during the intervals T3 and T4, the latch data L1 is maintained until the next interval T5.

2

At the interval T3, the level of a signal ø3 for setting a word voltage at the third-stage voltage is "H" and the sense amplifier 713, therefore, outputs data when the word level is at the third stage.

Next, when the interval moves from T3 to T4, the level of the signal ø3 inputted into the latch circuit 743 changes from "H" to "L". Due to this, the output data of the sense amplifier 713 is latched by the third-stage latch circuit 743. As in the case of the above, since the level of the latch signal ø3 is "L" during the intervals T4 and T5, the latch data L3 is maintained until the next interval T6. The latch data is then transmitted, through the third-stage latch circuit 743, to the encoder circuit 717, operated with the first-stage latch output L1 by the EOR logic gate 715 and the superordinate data B1 is thereby determined and transmitted to the output circuit 718. Namely, at this point, the superordinate data B1 on the truth table shown in FIG. 2 is determined. Through the above-stated circuit operation, the sense amplifier 713 in this example constantly operate with word voltages at the respective stages when reading one cell 712.

The conventional circuit, however, has the following disadvantages. It is obvious that a cell turned on as a result of reading the second-stage cell is also turned on at the third-stage word voltage. In addition, it is obvious that a cell turned off as a result of reading the second-stage cell is also turned off at the first-stage word voltage. However, since the sense amplifier constantly operates to latch sense amplifier outputs at the respective word voltages, excessive power is consumed.

The basic constitution of a multilevel storage semiconductor memory is described in Japanese Patent Application Laid-Open No. 1-196791. A multilevel memory capable of reducing the number of sense amplifiers to allow reducing chip area is described in Japanese Patent Application Laid-Open No. 7-37393. A multilevel memory intended to accelerate data reading speed is described in Japanese Patent Application Laid-Open No. 10-11982. A semiconductor memory capable of reading minute multilevel data is described in Japanese Patent Application Laid-Open No. 11-110974. None of these prior arts described in the publications are, however, intended to reduce power consumption based on sense amplifier operation.

SUMMARY OF THE INVENTION

It is an object of the present invention to provide a multilevel storage semiconductor memory capable of removing excessive sense amplifier operation and reducing sense amplifier power consumption by using sense amplifier operation stop circuit and latch input correction circuit.

A multilevel storage semiconductor memory read circuit according to the present invention is for applying a plurality of stages of word voltages to one cell and latching data according to respective word voltage levels, and comprises a sense amplifier reading the cell; a latch circuit group consisting of a plurality of latch circuits and latching the data according to the respective word voltage levels; an encoder circuit converting outputs of the latch circuits into binary data; a stop and correction circuit stopping a circuit operation of the sense amplifier when a different-stage latch circuit performs a read operation based on an output result of a specified-stage latch circuit, and applying a signal expected to be outputted from the sense amplifier, which is being stopped, as an input signal L0 of the latch circuit group.

In case of, for example, a four-level cell with three latch circuits of the first-stage latch circuit, the second-stage latch circuit and the third-stage latch circuit, the cell turned on as a result of reading the cell at the second stage has a lower cell threshold value than a second-stage word voltage and the cell is obviously turned on when read at a third-stage word voltage higher than the second-stage word voltage. The cell turned on as a result of reading the cell at the second stage has a higher cell threshold value than the second-stage word voltage and the cell is obviously turned off when read at the first-stage word voltage lower than the second-word voltage. According to the present invention, the operation of the sense amplifier is stopped only in such a case of reading the cell as to satisfy these two conditions. In addition, by supplying data expected to be outputted from the sense amplifier during a sense amplifier stop period from the latch input correction transistor, it is possible to reduce power consumption.

For example, if a read result of the cell at the second stage is "OFF" when a control signal ø1 for reading the cell at a first-stage word voltage becomes "H", it is estimated that the cell threshold value is higher than the second-stage word voltage and that the result is "OFF". Thus, the stop and correction circuit stops the operation of the sense amplifier and applies an "H" signal indicating "OFF" to a latch input signal line. In addition, if the read result of the cell at the second stage is "ON" when a level of a control signal ø3 for reading the cell at the third-stage word voltage becomes "H", it is estimated that the cell threshold value is lower than the second-stage word voltage and that the result is "ON". Thus, the stop and correction circuit stops the operation of the sense amplifier and applies an "L" signal indicating "ON" to the latch input signal line.

To be specific, the multilevel storage semiconductor memory read circuit is constituted such that the latch circuit group has a first-stage latch circuit, a second-stage latch circuit and a third-stage latch circuit; the specified-stage latch circuit is the second-stage latch circuit; the stop and correction circuit comprises: a first NAND logic gate inputting an output L2 of the specified-stage latch circuit and inputting a first-stage word voltage control signal ø1; a second NAND logic gate inputting a specified-stage latch circuit output L2 at one of input terminals through a first inverter and inputting a third-stage word voltage control signal ø3 at the other input terminals; a first P-channel transistor having, as a drain, an input line L0 of the latch circuit group and a source set at a VCC level; a first N-channel transistor having, as a drain, the input line L0 of the latch circuit group and a source set at a GND level; a third NAND logic gate inputting an output of the first NAND logic gate and an output of the second NAND logic gate; a second P-channel transistor having, as a drain, a VCC-side power supply wiring VS supplying power to the sense amplifier, and a source set at the VCC level; and a second N-channel transistor having, as a drain, a GND-side power supply wiring GS of the sense amplifier and a source set at the GND level, and that an output of the third logic gate is connected to a gate of the second P-channel transistor, the output of the third logic gate is connected to a gate of the second N-channel transistor through a second inverter, the output of the first logic gate is connected to a gate of the first P-channel transistor, and the output of the third NAND logic gate is connected to a gate of the first N-channel transistor through a third inverter.

In this case, the encoder circuit can be constituted to have an EOR logic gate inputting an output of the first-stage latch circuit and an output of the third-stage latch circuit; to output an output of the EOR logic gate to the output circuit as superordinate data B1, and to output an output of the second-stage latch circuit to the output circuit as subordinate data B0.

Further, the multilevel storage semiconductor memory read circuit can be constituted such that the latch circuit group has the first-stage latch circuit to an (n−1)th-stage latch circuit; the specified-stage latch circuit is an (n/2)th-stage latch circuit; and the stop and correction circuit comprises: a first OR logic gate inputting a first-stage word voltage control signal ø1 to an (n/2−1)th-stage word voltage control signal ø(n/2−1); a second OR logic gate inputting an (n/2+1)th-stage word control signal ø(n/2+1) to an (n−1)th-stage word voltage control signal ø(n−1); a first NAND logic gate inputting an output L(n/2) of the (n/2)th-stage latch circuit and an output of the first OR logic gate; a second NAND logic gate inputting, at one of input terminals, the output L(n/2) of the (n/2)th-stage latch circuit through a first inverter and inputting, at the other input terminal, an output of the second OR logic gate; a first P-channel transistor having, as a drain, an input line L0 of the latch circuit group and a source set at a VCC level; a first N-channel transistor having, as a drain, the input line L0 of the latch circuit group and a source set at a GND level; a third NAND logic gate inputting an output of the first NAND logic gate and an output of the second NAND logic gate; a second P-channel transistor having, as a drain, a VCC-side power supply wiring VS supplying power to the sense amplifier and a source set at the VCC level; and a, second N-channel transistor having, as a drain, a GND-side power supply wiring GS of the sense amplifier and a source set at the GND level, and such that an output of the third logic gate is connected to a gate of the second P-channel transistor, the output of the third logic gate is connected to a gate of the second N-channel transistor through a second inverter, an output of the first logic gate is connected to a gate of the first P-channel transistor, and the output of the third logic gate is connected to a gate of the first N-channel transistor through a third inverter.

Moreover, the latch circuit can be constituted to comprise: a first transfer transistor inputting an output of the sense amplifier at a drain; a fourth inverter connected to a source of the first transfer transistor; circuit for inputting a latch pulse øn into a gate of an N-channel transistor of the first transfer transistor and inputting an inverted pulse of the latch pulse øn inverted by a fifth inverter, into a gate of a P-channel transistor; a second transfer transistor; circuit for inputting a latch pulse ø into a gate of a P-channel transistor of the second transfer transistor and inputting an inverted pulse of the latch pulse ø inverted by the fifth inverter, into a gate of an N-channel transistor; and circuit for inputting an output of the fourth inverter into a drain of the second transfer transistor through a sixth inverter, and for connecting the source of the first transfer transistor to a source of the second transfer transistor, and such that the output of the fourth inverter is an output of the latch circuit.

As stated above, according to the present invention, the power consumption of the sense amplifier is extremely reduced. In a conventional case of reading a four-level cell, for example, three word voltages of a first-stage voltage, a second-stage voltage and a third-stage voltage are inputted into the cell and the cell is read by a total of three sense amplifier operations. According to the present invention, by contrast, the four-level cell can be read by two sense amplifier operations. Hence, in case of the four-level cell, the power consumption of the sense amplifier is reduced to ⅔.

BRIEF DESCRIPTION OF THE DRAWINGS

FIG. 2 is a truth table of the conventional circuit;

FIG. 7 is a truth table for the read operation in the first embodiment;

FIG. 9 is a timing chart of the read operation of the read circuit in the second embodiment; and FIG. 10 is a truth table of the read operation in the second embodiment.

DESCRIPTION OF THE PREFERRED EMBODIMENT

Figure 1:
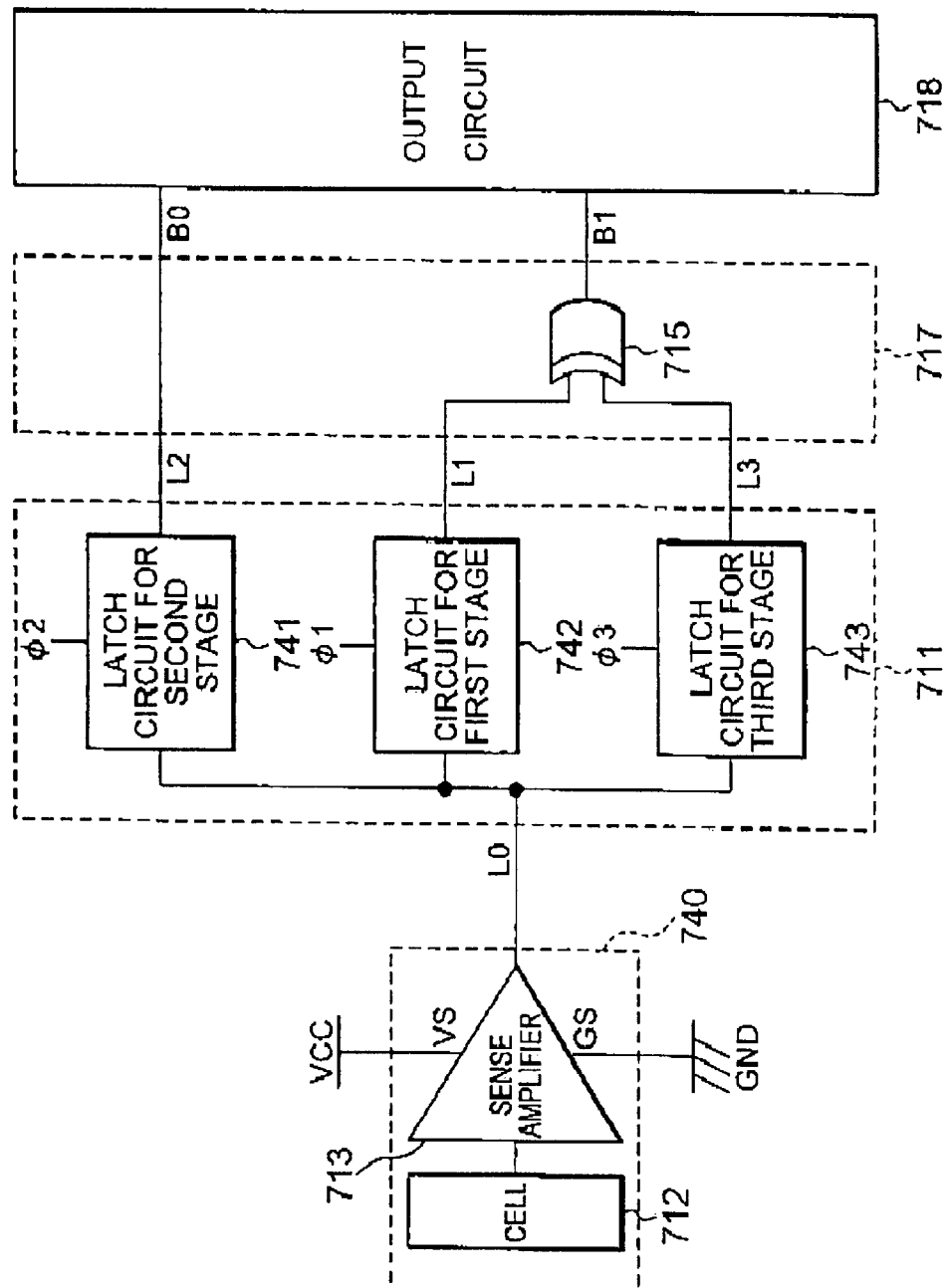
FIG. 1 is a circuit diagram showing a conventional multilevel storage semiconductor memory read circuit.
Figure 3:
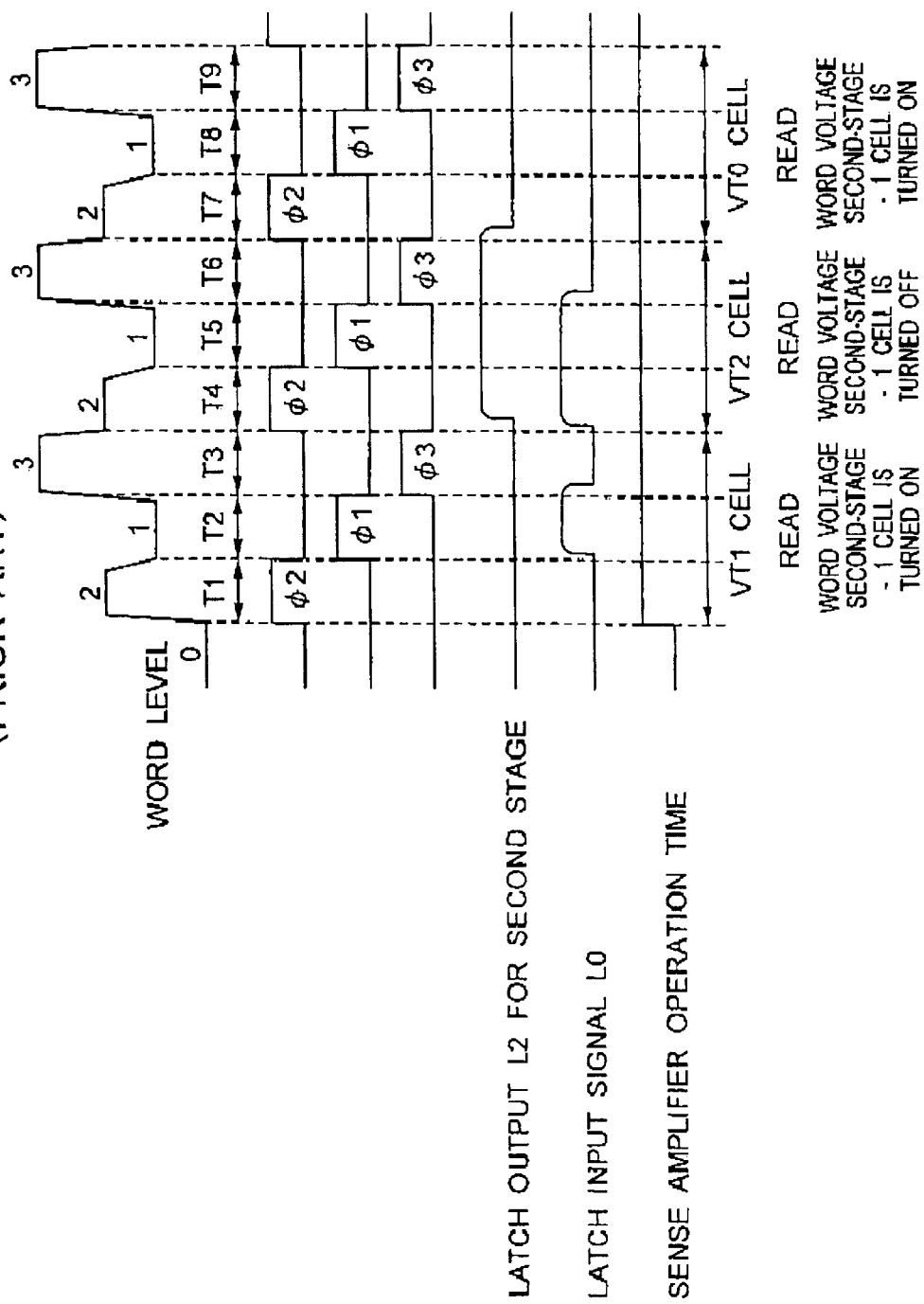
FIG. 3 is a timing chart of the read operation of the conventional circuit.
Figure 4:
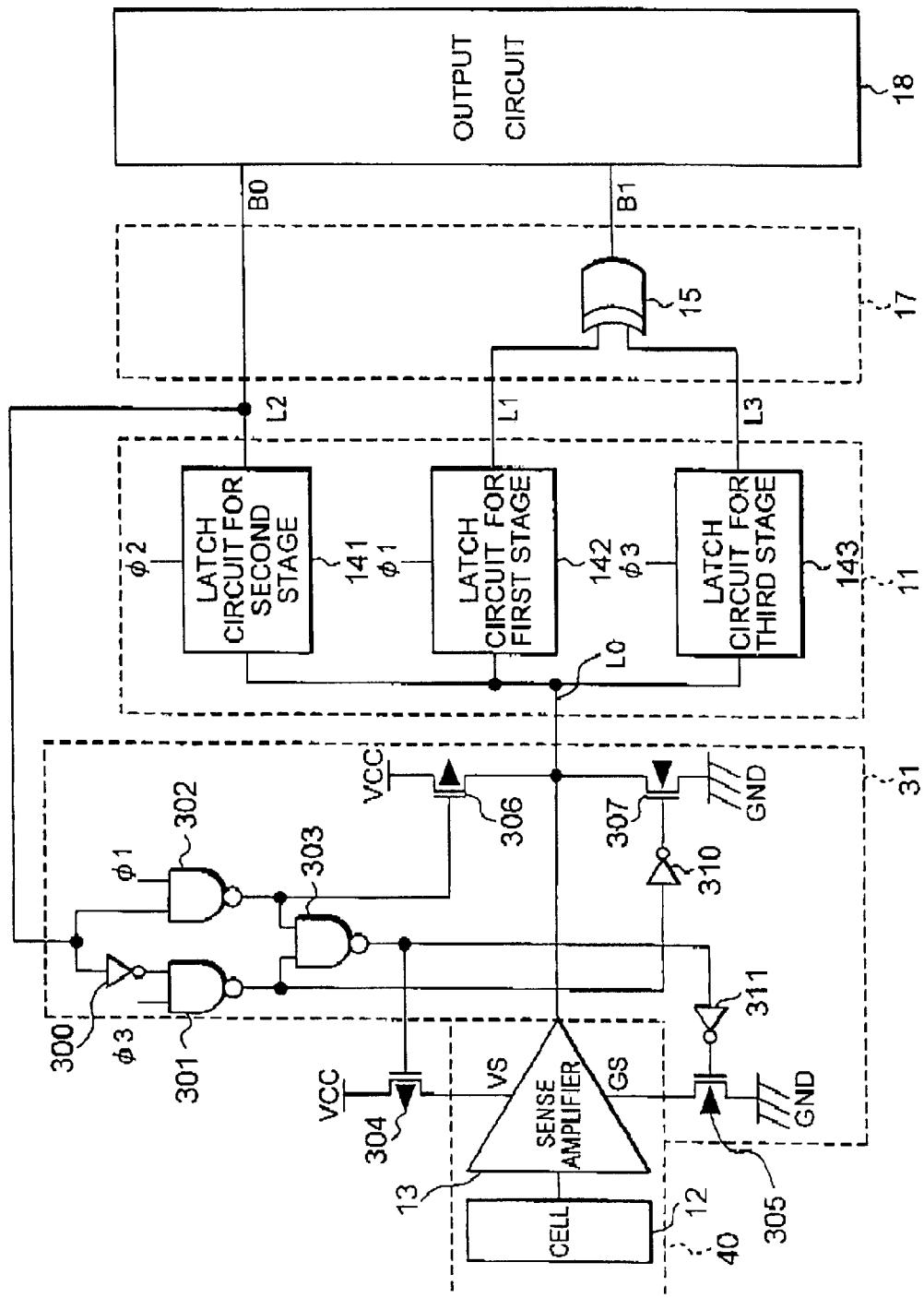
FIG. 4 is a circuit diagram showing a multilevel storage semiconductor memory in the first embodiment according to the present invention.
Figure 5:
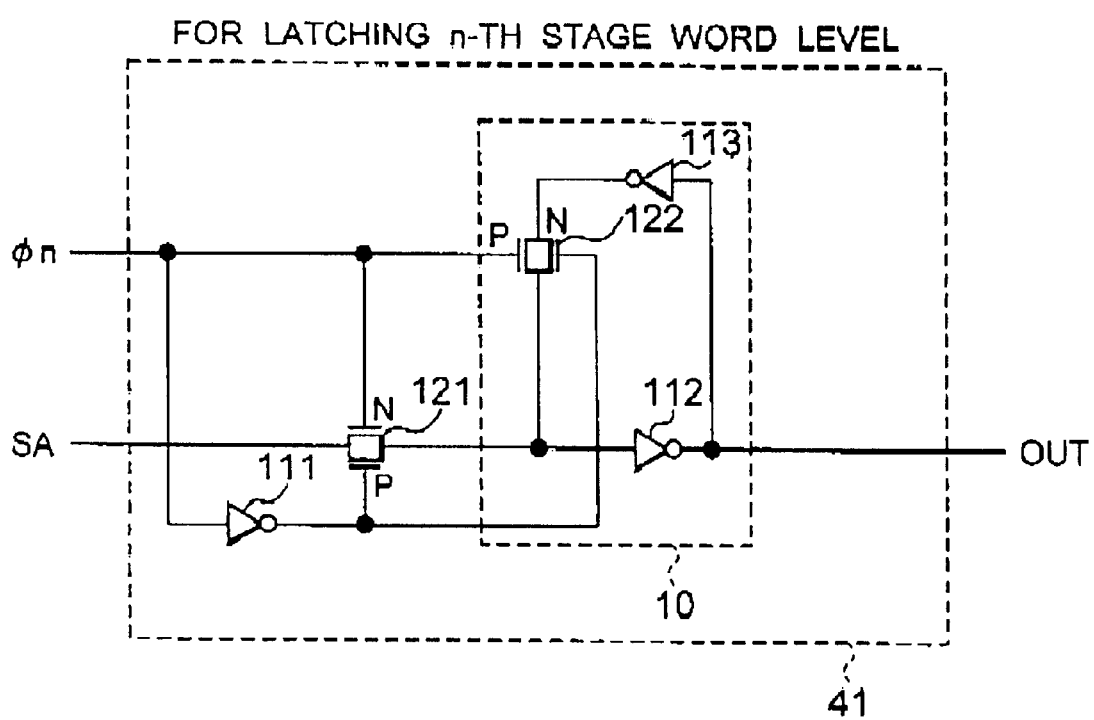
FIG. 5 is a circuit diagram showing a latch circuit in the first embodiment.

The embodiments of the present invention will be concretely described hereinafter with reference to the accompanying drawings. FIG. 4 is a circuit diagram showing a multilevel storage semiconductor memory read circuit in the first embodiment according to the present invention. FIG. 5 is a circuit diagram showing a latch circuit in this embodiment. Referring to FIG. 4, a read circuit 40 consists of a sense amplifier 13 amplifying a current flowing in a cell 12 and determining whether the cell is an ON cell or an OFF cell, a latch circuit group 11 having latch circuits 141, 142 and 143 latching output data from the sense amplifier 13, an encoder circuit 17 converting the latched data into binary data, an output circuit 18 outputting the encoded data, and a circuit 31 stopping the operation of the sense amplifier circuit at the first or third stage based on the output result of the second-stage latch circuit 141 and applying a signal which was expected to be outputted from the sense amplifier which is being stopped as a latch input signal L0.

The circuit 31 has two functions, i.e., a function of correcting a latch input signal and a function of stopping the sense amplifier. The constituent elements of the part of the circuit 31 which part has the former function, include an NAND logic gate 302 inputting the output L2 of the second-stage latch circuit 141 and a word voltage control signal ø1 for the first stage, an NAND logic gate 301 inputting a second-stage latch circuit through an inverter 300 at one input terminal and inputting a word voltage control signal ø3 for the third stage at the other input terminal, a P-channel transistor 306 having a latch input line L0 used as a drain and a source set at a VCC level, and an N-channel transistor 307 having the latch input line L0 used as a drain and a source set at a GND level. The output of the logic circuit 302 is connected to the gate of the transistor 306 and the output of the logic gate 301 is connected to the gate of the transistor 307 through an inverter 310.

The constituent elements of the part of the circuit 31 which part has the latter function, include an NAND logic gate 303 inputting the outputs of the logic gates 301 and 302, a P-channel transistor 304 having a VCC-side power supply wiring VS which supplies power to the sense amplifier circuit used as a drain and a source set at the VCC level, and an N-channel transistor 305 having a GND-side power supply wiring GS of the sense amplifier circuit used as a drain and a source set at the GND level. The output of the logic gate 303 is connected to the gate of the transistor 304 and the output of the logic gate 303 is connected to the gate of the transistor 305 through an inverter 311.

Next, the constitutions of the latch circuits 141, 142 and 143 will be described in detail with reference to FIG. 5. The latch circuits 141, 142 and 143 are exactly the same in constitution but different only in an inputted latch signal. Therefore, description will be given while assuming that the latch circuit is an n-th-stage latch circuit into which øn is inputted. An output SA (or L0 in FIG. 4) from the sense amplifier 13 is connected to the drains of a P-channel transistor and an N-channel transistor of a transfer transistor 121. The latch pulse øn is inputted into the gate of the N-channel transistor of the transfer transistor 121 and an inverted pulse of the latch pulse øn inverted by an inverter 111 is inputted into the gate of the P-channel transistor of the transfer transistor 121. The latch pulse øn is further inputted into the gate of a P-channel transistor of a transfer transistor 122 provided to open and close a larch section 10. Moreover, the latch pulse øn is inverted by the inverter 111 and inputted into the gate of an N-channel transistor of the transfer transistor 122. The source of the transfer transistor 121 is connected to the inverter 112 of the latch section 10 and to the source of the transfer transistor 122 provided to open and close the latch section 10. The output of the inverter 112 is connected to the inverter 113 of the latch section 10 and the output of the inverter 113 is connected to both the drain of the transfer transistor 122 and the encoder circuit 17.

Finally, the constitution of the encoder circuit 17 converting a signal into binary data will be described. In the example of FIG. 4, the output signal L2 of the second-stage latch circuit 141 is set at the subordinate data B0 as it is, the output signals L1 and L3 of the first-stage and third-stage latch circuits 142 and 143, respectively, are inputted into the EOR logic gate 15, and data generated in the EOR logic gate 15 is outputted as superordinate data B1. Namely, the encoder circuit 17 consists of the EOR logic gate 15 inputting signals L1 and L3. The output terminal of the gate 15 is connected to the output circuit 18 and the signal L2 is connected to the output circuit 18 as it is.

With this constitution, therefore, the logic gates 301, 302 and 303 determine which can be stopped, a sense amplifier circuit operation period ø1 or ø3, the transistors 304 and 305 stop the circuit operation of the sense amplifier 13 and at the same time, and the transistors 306 and 307 correct the latch input signal in a stop period, whereby a normal latch signal is transmitted to the latch circuits 141, 142 and 143 while shortening the circuit operation time of the sense amplifier 13, the latched signal is converted into binary data by the encoder circuit 17 and the resultant data is transmitted to the output circuit 18.

Figure 6:
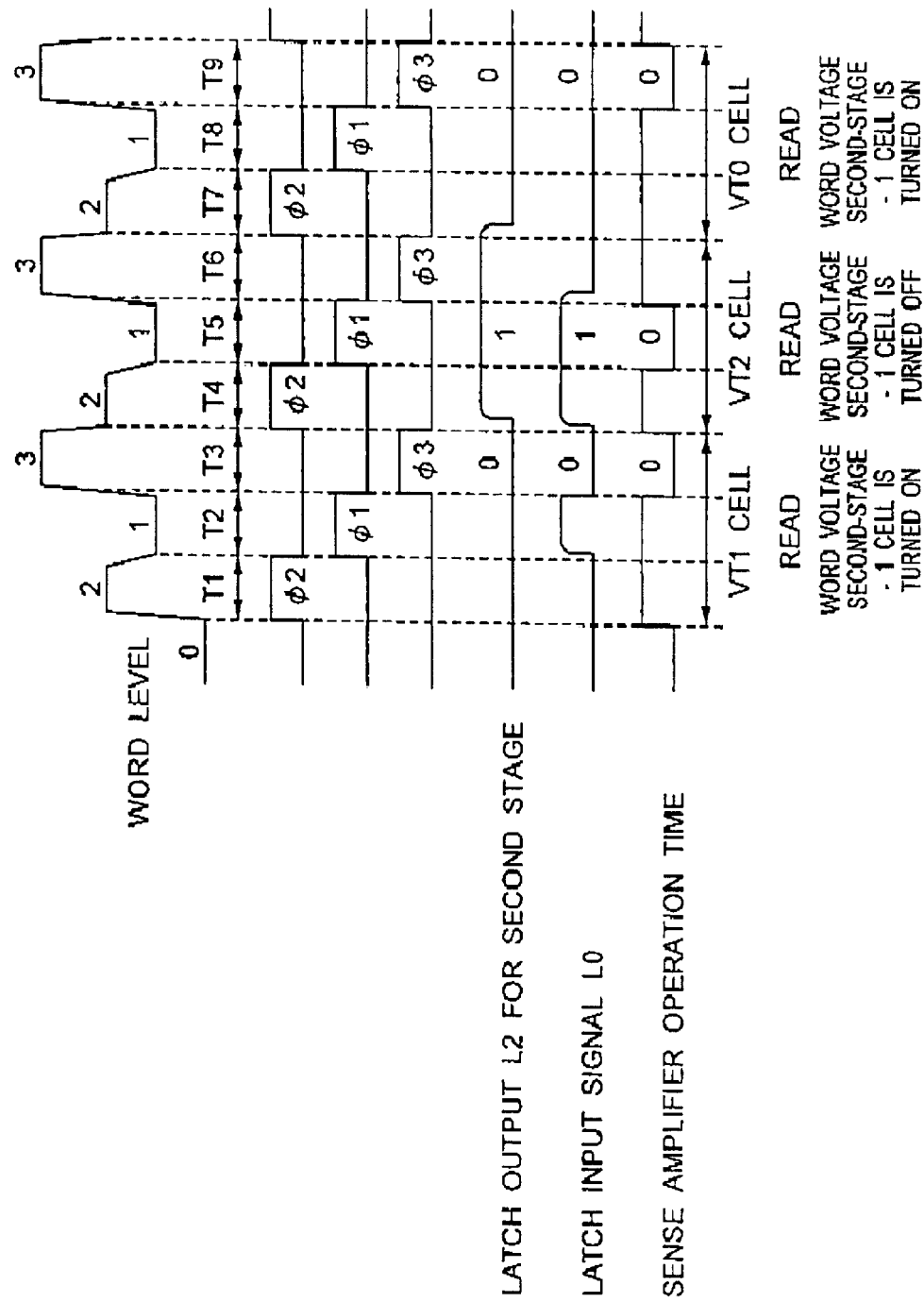
FIG. 6 is a timing chart of the read operation of the read circuit in the first embodiment.

Next, the operation of the circuit shown in FIG. 4 will be described. FIG. 6 is a timing chart for important signals. FIG. 7 is a truth table. By way of example, a cell having a threshold value VT1 is read at intervals T1 to T3 and a cell having a threshold value VT2 is read at intervals T4 to T6. First, at the interval T1, the level of the signal ø2 for setting the word voltage at the second-stage voltage is "H" and the sense amplifier 13, therefore, reads the cell when the word level is at the second stage. As shown on the truth table of FIG. 7, since the cell VT1 is turned on at the second-stage word level, the sense amplifier 13 outputs "L" data indicating that the read cell has been turned "ON". Next, when the interval moves from T1 to T2, the level of the signal ø2 inputted into the latch circuit 141 changes from "H" to "L", so that the output data of the sense amplifier 13 is latched by the second-stage latch circuit 141 and transmitted to the output circuit 18 as subordinate data B0 through the encoder circuit 17. Namely, at this point, the subordinate data B0 on the truth table shown in FIG. 7 is determined. Further, since the level of the latch signal ø2 is "L" during the intervals T2 and T3, the level of the latch data L2 remains "L" until the interval T4. Also, at the interval T1, since the levels of the signals ø1 and ø3 are "L", both of the latch input correction transistors 306 and 307 are turned off and do not operate. Further, the sense amplifier stop circuit transistors 304 and 305 are kept to be turned on and do not operate.

In addition, at the interval T2, the level of the signal ø1 for setting the word voltage at the first-stage voltage is "H" and the sense amplifier 13, therefore, output data when the word level is at the first stage. Next, when the interval moves from T2 to T3, the level of the signal ø1 inputted into the latch circuit changes from "H" to "L", so that the output data of the sense amplifier 13 is latched by the first-stage latch circuit 142. Likewise, during the intervals T3 and T4, the level of the latch signal ø1 is "L" and the latch data L1 is, therefore, maintained until the next interval T5. Further, at the interval T2, the level of the output L2 of the second-stage latch circuit 141 is "L" and the level of the signal ø1 changes from "L" to "H". However, the output of the NAND logic gate 302 has no change and the latch input correction transistors 306 and 307 are kept to be turned off and do not operate. In addition, the sense amplifier stop circuit transistors 304 and 305 are kept to be turned on and do not operate.

Next, at the interval T3, the level of the signal ø3 for setting the word voltage at the third-stage voltage is "H". In this case, the latch input correction transistors 306, 307 and the sense amplifier stop circuit transistors 304 and 305 operate. To be specific, the level of the output L2 of the second-stage latch circuit is "L", the output of the NAND logic gate 301 inputting the inverted signal of the signal L2, therefore changes from "H" to "L", the latch input signal correction transistor 307 is turned on and the level of the latch input signal line L0 is fixed to "L". At the same time, the level of the output of the NAND gate 303 changes from "L" to "H" and the sense amplifier stop circuit transistors 304 and 305 are turned off to thereby stop the circuit operation of the sense amplifier 13. Next, at the interval T3, the latch input signal L0 which level is fixed to "L" by the latch input signal correction transistor 307 is transmitted, as latch data L3, to the encoder circuit 17 through the third-stage latch circuit while the level of the latch signal ø3 is "H", and operated with the first-stage latch output L1 by the EOR logic gate 15, the superordinate data B1 is determined and transmitted to the output circuit. Namely, at this point, the superordinate data B1 on the truth table shown in FIG. 7 is determined.

Next, at the interval T4, as in the case of the interval T1, the sense amplifier 13 outputs "H" indicating that the data when the word level is at the second stage, i.e., the read cell is "OFF". Next, when the interval moves from T4 to T5, as in the case of the interval T1, the output data of the sense amplifier 13 is latched by the second-stage latch circuit 141 and transmitted, as the subordinate data B0, to the output circuit 18 through the encoder circuit 17, and the level of the data is maintained "H" until the next interval T7. At the interval T4, since the levels of the signals ø1 and ø3 are "L", both of the latch input correction transistors 306 and 307 are turned off and the sense amplifier stop circuit transistors 304 and 305 are turned on and do not operate.

Further, at the interval T5, the level of signal ø1 for setting the word voltage at the first-stage level becomes "H". In this case, the latch input correction transistors 306 and 307 and the sense amplifier stop circuits operate. To be specific, since the level of the second-stage latch circuit output L2 is "H", the output level of the NAND logic gate 302 inputting the signal L2 changes from "H" to "L", the latch input signal correction transistor 306 is turned on and the level of the latch input signal line L0 is fixed to "H". At the same time, the output level of the NAND gate 303 changes from "L" to "H" and the sense amplifier stop circuit transistors 304 and 305 are turned off to thereby stop the sense amplifier circuit operation. Next, when the interval moves from T5 to T6, as in the case of the interval T2, the latch input signal L0 which level is fixed to "H" by the latch input signal correction transistor 306 is latched by the first-stage latch circuit 142. Likewise, since the level of the signal ø1 remains "L" during the intervals T6 and T7, the latch data L1 is maintained until the next interval T8.

Furthermore, at the interval T6, the signal ø3 for setting the word voltage at the third-stage level is "H", and the sense amplifier 13, therefore, outputs data when the word level is at the third stage. Next, the outputted data is transmitted to the encoder circuit 17 through the third-stage latch circuit 143, operated with the first-stage latch output L1 by the EOR logic gate 15, and the superordinate data B1 is determined and transmitted to the output circuit 18. At this interval T6, the level of the output L2 of the second-stage latch circuit 141 is "H" and the level of the signal ø3 changes from "L" to "H". However, the output of the NAND logic gate 301 has no change and none of the latch input correction transistors 306, 307 and the sense amplifier stop circuit transistors 304 and 305 operate.

By the above-stated circuit operation, the operation stop period of the sense amplifier in this operation example, is T3 during the intervals T1 to T3 and T5 during the intervals T4 to T6 as shown in the timing chart of FIG. 6. One out of three times of the sense amplifier operations required to read a four-level cell is stopped, thereby making it possible to reduce power consumed by the sense amplified circuit to ⅔.

Figure 8:
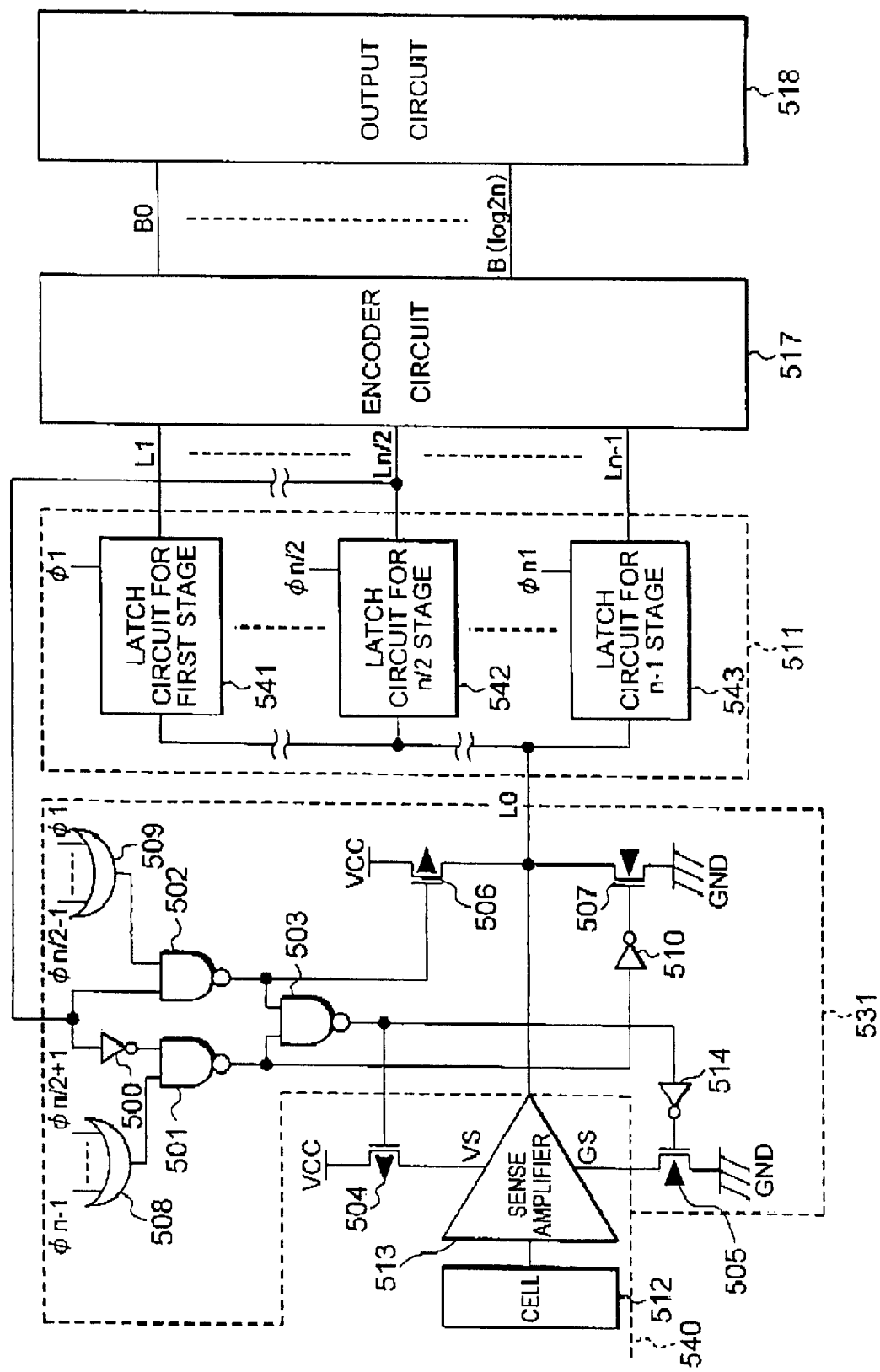
FIG. 8 is a circuit diagram showing a multilevel storage semiconductor memory read circuit in the second embodiment according to the present invention.

Next, a semiconductor memory in the second embodiment according to the present invention will be described. FIG. 8 is a circuit diagram showing the semiconductor memory in the second embodiment. FIG. 9 is a timing chart of FIG. 8. FIG. 10 is a truth table for read operation. It is noted that FIG. 10 shows a case of n=8 by way of example. Referring to FIG. 8, a read circuit 540 consists of a sense amplifier 513 amplifying a current flowing in a cell 512 and determining whether the cell is an ON cell or an OFF cell, a latch circuit group 511 latching output data from the sense amplifier 513, an encoder circuit 517 encoding the latched data, an output circuit 518 outputting the encoded data, and a circuit 531 stopping the operation of the sense amplifier at the first to (n/2−1)th stages or the (n/2+1)th to (n−1)th stages and applying a signal expected to be outputted from the sense amplifier which is being stopped, as a latch input.

The circuit 531 is constituted of a circuit having two functions, i.e., a function of correcting a latch input signal and a function of stopping the sense amplifier. The constituent elements of the part of the circuit 531 which part has the former function, include an NAND logic gate 502 inputting the output of a logic gate 509 into which word voltage control signals ø1 to ø(n/2−1) at the first to (n/2−1)th stages are inputted, and inputting the output L(n/2) of an (n/2)th stage latch circuit 542, an NAND logic gate 501 inputting the output of an OR logic gate 508 into which word voltage control signals ø(n/2+1) to ø(n−1) at the (n/2+1)th to (n−1)th stage are inputted, and inputting a signal inputted from the (n/2)th-stage latch circuit through an inverter 500, a P-channel transistor 506 having a latch input line L0 used as a drain and a source set at a VCC level, and an N-channel transistor 507 having the latch input line L0 used as a drain and a source set at a GND level. The output of the logic gate 502 is connected to the gate of the transistor 506 and the output of the logic gate 501 is connected to the gate of the transistor 507 through an inverter 510.

The constituent elements of the part of the circuit 531 which part has the latter function, include an NAND logic circuit 503 inputting the outputs of the logic gates 501 and 502, a P-channel transistor 504 having a VCC-side power supply wiring VS which supplies power to the sense amplifier as a drain and a source set at the VCC level, and an N-channel transistor 505 having the GND-side power supply wiring GS of the sense amplifier as a drain and a source set at the GND level. The output of the logic gate 503 is connected to the gate of the transistor 504, and the output of the logic gate 503 is connected to the gate of the transistor 505 through an inverter 514.

Next, the constitutions of the latch circuits will be described. The latch circuits 541 to 543 of the latch circuit group 511 have exactly the same constitution as that shown in FIG. 5 but only differ in an inputted latch signal. Description will be, therefore, given while assuming that the latch circuit is the n-th-stage latch circuit into which øn is inputted. An output SA (or L0 in FIG. 8) from the sense amplifier 13 is connected to the drains of the P-channel transistor and N-channel transistor of a transfer transistor 121. A latch pulse øn is connected to the gate of the N-channel transistor of the transfer transistor 121 and connected to the P-channel transistor of the transfer transistor 121 so as to input an inverted pulse of the latch pulse through the inverter 111. The latch pulse øn is also connected to the P-channel gate of a transfer transistor 122 provided to open and close a latch section 10 and connected to the N-channel gate of the transfer transistor 122 through the inverter 111 which generates the inverted pulse of the latch pulse. The source of the transfer transistor 121 is connected to the inverter 112 of the latch section 10 and to the source of the transfer transistor 122 provided to open and close the latch section 10. The output of the inverter 112 is connected to the inverter 13 of the latch section 10 and to the encoder circuit 517.

Although the detail of the encoder circuit 517 encoding a latched signal is not described herein, the encoder circuit 517 is a circuit having an encoding function to satisfy the truth table on which if n=8, 3-bit data is outputted.

Next, the operation of the circuit shown in FIG. 8 will be described. By way of example, it is assumed that a VT1 cell is read at intervals T1 to Tn−1. First, at the interval T1, the level of a signal ø(n/2) for setting the word voltage at the (n/2)th-stage level is "H" and the sense amplifier 513, therefore, reads the cell when the word level is at the (n/2)th stage. As shown on the truth table of FIG. 10, since the VT1 cell is turned on at the (n/2)th-stage word level (which corresponds to the word level of 4 (=n/2) since the truth table shown in FIG. 10 shows a case of n=8), it is assumed that the output L0 of the sense amplifier outputs data "L" indicating that the read cell is turned "ON". Next, when the interval moves from T1 to T2, the signal ø(n/2) inputted into the latch circuit 542 changes from "H" to "L". Due to this, the output data of the sense amplifier 513 is latched by the (n/2)th-stage latch circuit 542 and transmitted to the encoder circuit 517. Further, frog the intervals T2 to T7, the level of the latch circuit ø(n/2) is "L" and the level of the latch data L(n/2), therefore, remains "L" until the interval T8. Further, at the interval T1, since the levels of signals ø1 to ø(n/2−1) and those of signals ø(n/2+1) to ø(n−1) are "L", the latch input correction transistors 506 and 507 are turned off and do not operate. Besides, the sense amplifier stop transistors 504 and 505 are kept to be turned on and do not operate.

At the interval T2, since the level of the signal ø1 for setting the word voltage at the first-stage level is "H", the sense amplifier 513 outputs data when the word level is at the first stage. Next, when the interval moves from T2 to T3, the signal ø1 inputted into the latch circuit 541 changes from "H" to "L", and the output data of the sense amplifier 513 is, therefore, latched by the first-stage latch circuit 541 in the latch circuit group 511. Likewise, the level of the latch data L1 is maintained since the level of the latch signal ø1 is "L" until the next signal ø1 is inputted. Further, at the interval T2, the level of the (n/2)th-stage latch circuit output L2 is "L" and the signal ø1 changes from "L" to "H". However, the output of the NAND logic gate 502 has no change and the latch input correction transistors 506 and 507 are turned off and do not operate. Besides, the sense amplifier stop transistors 504 and 505 are kept to be turned on and do not operate.

As in the case of the interval T2, from the intervals T3 to T(n/2), sense amplifier outputs Lx according to the word voltages at the øx-th stages (x=2 to (n/2−1) are sequentially latched and held in the same operation as that at the interval T2. Also, during these intervals, the output of the NAND logic gate 502 has no change and both of the latch input correction transistors 506 and 507 are turned off and do not operate. Besides, the sense amplifier stop transistors 504 and 505 are kept to be turned on and do not operate.

Next, from the intervals T(n/2+1) to T(n−1), the level of a signal øx for setting the word voltages at the øx-th stages (x=(n/2+1) to (n−1)) at the x-th-stage level becomes "H". In this case, the latch input correction transistors 506 and 507 and the transistors 504 and 505 of the sense amplifier stop circuit operate. To be specific, the output of the OR gate 508 changes from "L" to "H" by the "H"-level øx signal and transmitted to the next-stage NAND logic gate 501. In addition, since the level of the output L (n/2) of the (n/2) th-stage latch circuit is "L", a signal "H" which is an inverted signal of the L(n/2) is also inputted into the logic gate 501. As a result, the output level of the NAND logic gate 501 changes from "H" to "L". Then, the latch input signal correction transistor 507 is turned on and the level of the latch input signal L0 is fixed to "L". At the same time, the output level of the NAND gate 503 changes from "L" to "H", and the sense amplifier stop transistors 504 and 505 are turned off to thereby stop the circuit operation of the sense amplifier 513. Next, during the intervals T(n/2+1) to T(n−1), the latch input signal L0 which level is fixed to "L" by the latch input signal correction transistor 507 is transmitted to the encoder circuit 517 through the x-th-stage latch circuit while the level of the latch signal øx is "H", encoded by the encoder circuit 517 and transmitted to the output circuit 518.

By the above-stated circuit operation, the operation stop period of the sense amplifier 513 in this operation example is the intervals T(n/2+1) to T(n−1) during the intervals T1 to T(n−1). The (n/2−1) times out of the (n−1) times of the sense amplifier operations required to read an n-level cell are stopped, thereby making it possible to reduce power consumed by the sense amplifier. To be specific, the sense amplifier operation time of the circuit 531 can be reduced to 4/7 (57.1%) for an 8-level cell and to 8/15 (53.3%) for a 16-level cell. Hence, it is possible to greatly reduce the power consumption of the sense amplifier 513.

What is claimed is:

1. A multilevel storage semiconductor memory read circuit for applying a plurality of stages of word voltages to one cell and latching data according to respective word voltage levels, comprising:

a sense amplifier reading the cell;

a latch circuit group consisting of a plurality of latch circuits and latching the data according to the respective word voltage levels;

an encoder circuit converting outputs of said latch circuits into binary data; and a stop and correction circuit stopping a circuit operation of said sense amplifier when a different-stage latch circuit performs a read operation based on an output result of a specified-stage latch circuit, and applying a signal expected to be outputted from the sense amplifier which is being stopped, as an input signal L0 of said latch circuit group.

2. A multilevel storage semiconductor memory read circuit according to claim 1, wherein said stop and correction circuit stops the operation of the sense amplifier and applies an "H" signal indicating "OFF" to a latch input signal line if a result of reading the cell at said specified stage is "OFF" when a control signal ø1 for reading the cell at a first-stage word voltage becomes "H"; and said stop and correction circuit stops the operation of the sense amplifier and applies an "L" signal indicating "ON" to the latch input signal line if the result of reading the cell at said specified stage is "ON" when a level of a control signal ø3 for reading the cell at a highest-stage word voltage becomes "H".

3. A multilevel storage semiconductor memory read circuit according to claim 1, wherein said latch circuit group has a first-stage latch circuit, a second-stage latch circuit and a third-stage latch circuit;

said specified-stage latch circuit is the second-stage latch circuit;

said stop and correction circuit comprises:

a first NAND logic gate inputting an output L2 of said specified-stage latch circuit and inputting a first-stage word voltage control signal ø1;

a second NAND logic gate inputting a specified-stage latch circuit output L2 at one of input terminals through a first inverter and inputting a third-stage word voltage control signal ø3 at the other input terminal;

a first P-channel transistor having, as a drain, an input line L0 of the latch circuit group and a source set at a VCC level;

a first N-channel transistor having, as a drain, said input line L0 of the latch circuit group and a source set at a GND level;

a third NAND logic gate inputting an output of said first NAND logic gate and an output of said second NAND logic gate;

a second P-channel transistor having, as a drain, a VCC-side power supply wiring VS supplying power to said sense amplifier, and a source set at the VCC level; and a second N-channel transistor having, as a drain, a GND-side power supply wiring GS of the sense amplifier and a source set at the GND level, wherein an output of said third NAND logic gate is connected to a gate of said second P-channel transistor, the output of said third NAND logic gate is connected to a gate of the second N-channel transistor through a second inverter, the output of said first NAND logic gate is connected to a gate of said first P-channel transistor, and the output of said third NAND logic gate is connected to a gate of said first N-channel transistor through a third inverter.

4. A multilevel storage semiconductor memory read circuit according to claim 3, wherein said encoder circuit has an EOR logic gate inputting an output of said first-stage latch circuit and an output of said third-stage latch circuit; and said encoder circuit outputs an output of the EOR logic gate to said output circuit as superordinate data B1, and outputs an output of said second-stage latch circuit to said output circuit as subordinate data B0.

5. A multilevel storage semiconductor memory read circuit according to claim 2, wherein said latch circuit group has the first-stage latch circuit to an (n−1)th-stage latch circuit;

said specified-stage latch circuit is an (n−2)th-stage latch circuit; and said stop and correction circuit comprises:

a first OR logic gate inputting a first-stage word voltage control signal ø1 to an (n/2−1)th-stage word voltage control signal ø(n/2−1);

a second OR logic gate inputting an (n/2+1)th-stage word control signal ø(n/2+1) to an (n−1)th-stage word voltage control signal ø(n−1);

afirst NAND logic gate inputting an output L(n/2) of said (n/2)th-stage latch circuit and an output of said first OR logic gate;

a second NAND logic gate inputting, at one of input terminals, the output L(n/2) of said (n/2)th-stage latch circuit through a first inverter and inputting, at the other input terminal, an output of said second OR logic gate;

a first P-channel transistor having, as a drain, an input line L0 of the latch circuit group and a source set at a VCC level;

a first N-channel transistor having, as a drain, said input line L0 of the latch circuit group and a source set at a GND level;

a third NAND logic gate inputting an output of said first NAND logic gate and an output of said second NAND logic gate;

a second P-channel transistor having, as a drain, a VCC-side power supply wiring VS supplying power to said sense amplifier and a source set at the VCC level; and a second N-channel transistor having, as a drain, a GND-side power supply wiring GS of the sense amplifier and a source set at the GND level, wherein an output of said third logic gate is connected to a gate of said second P-channel transistor, the output of said third logic gate is connected to a gate of the second N-channel transistor through a second inverter, an output of said first logic gate is connected to a gate of said first P-channel transistor, and the output of said third logic gate is connected to a gate of said first N-channel transistor through a third inverter.

6. A multilevel storage semiconductor memory read circuit according to claim 1, wherein said latch circuit comprises:

a first transfer transistor inputting an output of said sense amplifier at a drain;

a fourth inverter connected to a source of said first transfer transist or;

circuit for inputting a latch pulse øn into a gate of an N-channel transistor of said first transfer transistor and inputting an inverted pulse of the latch pulse øn inverted by a fifth inverter, into a gate of a P-channel transistor;

a second transfer transistor;

circuit for inputting a latch pulse ø into a gate of a P-channel transistor of the second transfer transistor and inputting an inverted pulse of the latch pulse ø inverted by the fifth inverter, into a gate of an N-channel transistor; and circuit for inputting an output of said fourth inverter into a drain of said second transfer transistor through a sixth inverter, and for connecting the source of said first transfer transistor to a source of said second transfer transistor, and the output of said fourth inverter is an output of said latch circuit.

* * * * *

UNITED STATES PATENT AND TRADEMARK OFFICE
CERTIFICATE OF CORRECTION

PATENT NO.   : 6,377,497 B2
DATED        : April 23, 2002
INVENTOR(S)  : Akira Sato It is certified that error appears in the above-identified patent and that said Letters Patent is hereby corrected as shown below:

Column 12,
Line 26, change "afirst" to -- a first --.

Column 13,
Line 2, change "transist" to -- transistor --.

Signed and Sealed this

Thirty-first Day of December, 2002

JAMES E. ROGAN
*Director of the United States Patent and Trademark Office*